(12) United States Patent
Kwon et al.

(10) Patent No.: US 10,629,467 B2
(45) Date of Patent: Apr. 21, 2020

(54) ELECTROSTATIC CHUCK AND PLASMA APPARATUS FOR PROCESSING SUBSTRATES HAVING THE SAME

(71) Applicant: SAMSUNG ELECTRONICS CO., LTD., Suwon-si, Gyeonggi-do (KR)

(72) Inventors: Ohyung Kwon, Seongnam-si (KR); Kyung-Sun Kim, Suwon-si (KR); Jae-Hoon Kim, Seoul (KR); Doug-Yong Sung, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 396 days.

(21) Appl. No.: 15/608,140

(22) Filed: May 30, 2017

(65) Prior Publication Data

US 2017/0358475 A1    Dec. 14, 2017

(30) Foreign Application Priority Data

Jun. 14, 2016  (KR) .................. 10-2016-0073676

(51) Int. Cl.
| | |
|---|---|
| *H01L 21/683* | (2006.01) |
| *H01J 37/32* | (2006.01) |
| *H01L 21/48* | (2006.01) |
| *H01L 21/687* | (2006.01) |
| *H01L 21/764* | (2006.01) |
| *H02N 13/00* | (2006.01) |

(52) U.S. Cl.
CPC ........ *H01L 21/6833* (2013.01); *H01J 37/321* (2013.01); *H01J 37/32697* (2013.01); *H01L 21/4871* (2013.01); *H01L 21/687* (2013.01); *H01L 21/6831* (2013.01); *H01L 21/764* (2013.01); *H02N 13/00* (2013.01)

(58) Field of Classification Search
CPC .......................... H01L 21/6833; H01J 37/321
See application file for complete search history.

(56) References Cited

U.S. PATENT DOCUMENTS

| | | | |
|---|---|---|---|
| 7,525,787 B2 | 4/2009 | Dhindsa et al. | |
| 7,683,289 B2 | 3/2010 | Dhindsa et al. | |
| 8,617,351 B2 | 12/2013 | Hoffman et al. | |
| 2006/0081558 A1* | 4/2006 | Collins ............ | H01J 37/32082 216/67 |
| 2011/0155322 A1* | 6/2011 | Himori ............ | H01J 37/32091 156/345.33 |
| 2011/0159211 A1 | 6/2011 | Du Bois et al. | |
| 2012/0180953 A1 | 7/2012 | Ozaki et al. | |
| 2014/0147990 A1 | 5/2014 | Hawrylchak et al. | |

(Continued)

FOREIGN PATENT DOCUMENTS

JP    2014-231633 A    12/2014

*Primary Examiner* — Scott Bauer
(74) *Attorney, Agent, or Firm* — Lee IP Law, P.C.

(57) ABSTRACT

An electrostatic chuck assembly includes a dielectric plate having an absorption electrode to generate an electrostatic force, the dielectric plate securing a substrate by the electrostatic force, a conductive base plate under the dielectric plate to be applied with a high frequency electric power, the conductive base plate being an electrode to generate plasma, and an insulating plate under the base plate, the insulating plate having an insulation body and an insulation sink, and the insulation sink having a dielectric constant lower than that of the insulation body.

23 Claims, 6 Drawing Sheets

(56) References Cited

U.S. PATENT DOCUMENTS

2014/0224426 A1    8/2014  Kim et al.
2015/0155140 A1    6/2015  Lee et al.
2017/0352565 A1*  12/2017  Zhang ............... H01L 21/68742

* cited by examiner

ELECTROSTATIC CHUCK AND PLASMA APPARATUS FOR PROCESSING SUBSTRATES HAVING THE SAME

CROSS-REFERENCE TO RELATED APPLICATION

Korean Patent Application No. 10-2016-0073676, filed on Jun. 14, 2016, in the Korean Intellectual Property Office, and entitled: "Electrostatic Chuck and Plasma Apparatus for Processing Substrates Having the Same," is incorporated by reference herein in its entirety.

BACKGROUND

1. Field

Example embodiments relate to an electrostatic chuck and a plasma apparatus for processing substrates having the same, and more particularly, to an electrostatic chuck having high plasma density and a semiconductor plasma apparatus having the same.

2. Description of the Related Art

A fine patterning process for semiconductor devices and flat panel devices usually requires that the substrates, on which the patterning process is conducted, be secured to a fixed stage and be flat in a process chamber. Recently, an electrostatic chuck assembly has been widely used as the fixed stage for securing the substrate, in view of a sufficient flatness of the substrate and minimal particles in the patterning process. The electrostatic chuck assembly includes a plurality of electrodes in a dielectric plate, on which the substrate is located and secured by an electrostatic force when applying an electric power to the electrodes.

SUMMARY

According to exemplary embodiments, there is provided an electrostatic chuck assembly including a dielectric plate having an absorption electrode therein for generating an electrostatic force and to which a substrate may be secured by the electrostatic force, a conductive base plate positioned under the dielectric plate and to which a high frequency electric power may be applied such that the base plate functions as an electrode for generating plasma, and an insulating plate positioned under the base plate and having an insulation sink at which a dielectric constant may be lower than other portions thereof.

According to other exemplary embodiments, there is provided a plasma apparatus including a process chamber in which the plasma process is performed, a source supplier supplying source gases for the plasma process to the process chamber, an electrostatic chuck assembly arranged at a bottom of the process chamber and to which the substrate is secured, a plasma generator arranged at a top of the process chamber and generating a plasma of the source gases, and a power source supplying electric power to the electrostatic chuck assembly and the plasma generator. Particularly, the electrostatic chuck assembly may include a dielectric plate having an absorption electrode therein for generating an electrostatic force and to which a substrate may be secured by the electrostatic force, a conductive base plate positioned under the dielectric plate and to which a high frequency electric power may be applied such that the base plate functions as an electrode for generating plasma, and an insulating plate positioned under the base plate and having an insulation sink at which a dielectric constant may be lower than other portions thereof.

According to yet another exemplary embodiments, there is provided an electrostatic chuck assembly including a dielectric plate having an absorption electrode to generate an electrostatic force, the dielectric plate securing a substrate by the electrostatic force, a conductive base plate under the dielectric plate to be applied with a high frequency electric power, the conductive base plate being an electrode to generate plasma, and an insulating plate having at least one air gap therein, the conductive base plate being between the dielectric plate and the insulating plate.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
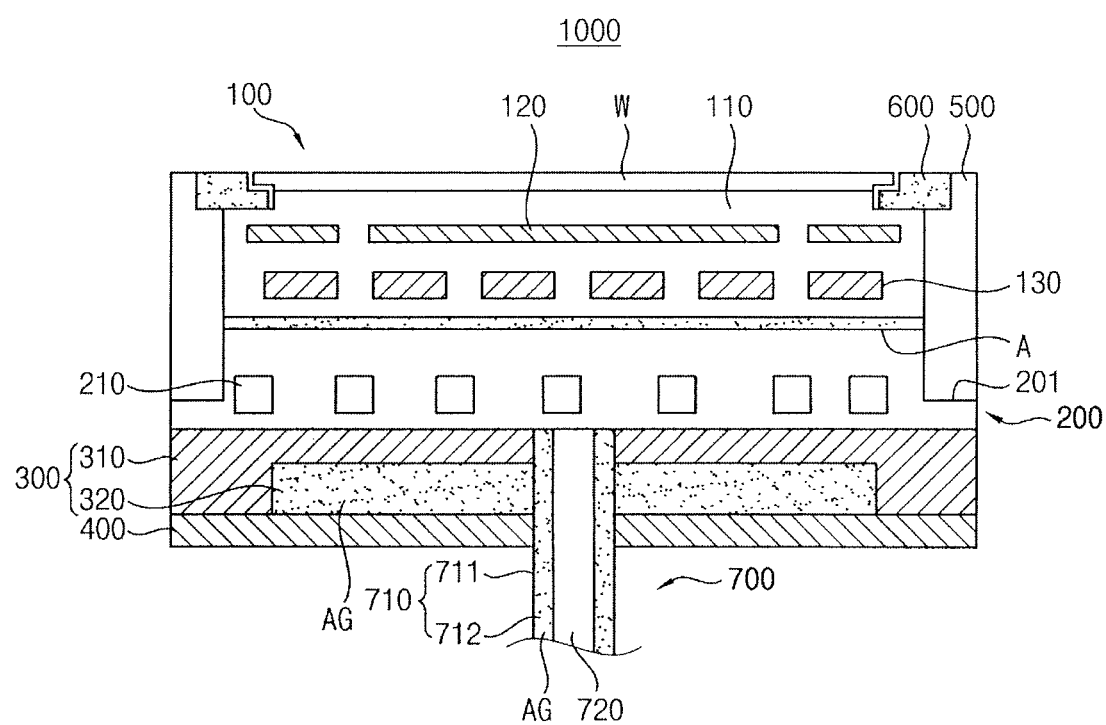
FIG. 1 illustrates a cross-sectional view of an electrostatic chuck assembly in accordance with an example embodiment.

Reference will now be made to example embodiments, which are illustrated in the accompanying drawings, wherein like reference numerals may refer to like components throughout.

FIG. 1 is a cross-sectional view illustrating an electrostatic chuck assembly in accordance with an example embodiment.

Referring to FIG. 1, the electrostatic chuck (ESC) assembly 1000 in accordance with an example embodiment may include a dielectric plate 100, a base plate 200, an insulating plate 300, a ground plate 400, a blocking ring 500, a focus ring 600, and a power guide structure 700.

For example, the dielectric plate 100 may include a dielectric body 110 that may be shaped into a disk and may be coupled to the underlying base plate 200, e.g., via a coupling member or via an adhesive A. The dielectric plate 100 may include dielectric materials such as a ceramic, e.g., aluminum oxide ($Al_2O_3$), aluminum nitride (AlN) and yttrium oxide ($Y_2O_3$), and a resin, e.g., polyimide. A substrate W may be arranged on the dielectric plate 100, and a plasma process may be performed on the substrate W. For example, the substrate W may include a silicon substrate, e.g., a wafer for manufacturing semiconductor devices, and a glass substrate for manufacturing flat panel devices.

An absorption electrode 120 and a heat electrode 130 may be provided in the dielectric body 110. An electrostatic force may be generated from the absorption electrode 120, and the substrate W may be secured to the dielectric plate 100 by the electrostatic force generated by the absorption electrode 120. The substrate W may be kept at a predetermined process temperature during the plasma process by the heat generated from the heat electrode 130.

A direct current may be applied to the absorption electrode 120, and the electrostatic force may be generated between the substrate W and the absorption electrode 120. Thus, the substrate W may be absorbed and secured to the dielectric plate 100. The absorption electrode 120 may be shaped into various configurations, e.g., a circular pattern, a ring shaped pattern, a pair of semicircular patterns, and combinations thereof.

The heat electrode 130 may generate Joule's heat, and the heat may be transferred to the substrate W until the substrate W reaches the predetermined process temperature. For example, the heat electrode 130 may be shaped into a circular pattern or a helical pattern having a center that coincides, e.g., aligns, with a center of the disk-shaped dielectric body 110.

For example, the absorption electrode 120 and the heat electrode 130 may include a metal, e.g., tungsten (W), copper (Cu), nickel (Ni), molybdenum (Mo), an alloy of nickel (Ni)-chrome (Cr) and an alloy of nickel (Ni)-aluminum (Al). In another example, the absorption electrode 120 and the heat electrode 130 may include a conductive ceramic, e.g., tungsten carbide (WC), molybdenum carbide (MoC), and titanium nitride (TiN). A sufficient resistance may be provided between the absorption electrode 120 and the heat electrode 130 in the dielectric plate 100, thereby preventing the electrical short between the absorption electrode 120 and the heat electrode 130, e.g., the absorption electrode 120 and the heat electrode 130 may be vertically spaced apart from each other within the dielectric plate 100.

The base plate 200 may include conductive materials, e.g., aluminum (Al), titanium (Ti), tungsten (W), stainless steel and various alloys thereof, and may be shaped into, e.g., a disk. For example, the base plate 200 may be high at a central portion and be low at a peripheral portion, thus a stepped portion 201 may be provided with the base plate 200, e.g., the stepped portion 201 may extend laterally from and be peripheral with respect to the central portion of the base plate 200. An upper surface area of the top portion of the base plate 200 may be substantially the same as that of the bottom portion of the dielectric plate 100, so the dielectric plate 100 may make contact, e.g., and completely overlap, with the top portion of the base plate 200. The stepped portion 201 of the base plate 200 may make contact with the insulating plate 300 at the bottom portion of the base plate 200.

The base plate 200 may be connected to the power guide structure 700, so a high frequency electric power may be applied to the base plate 200 from an external power source. Thus, the base plate 200 may function as a bottom electrode for generating plasma of the plasma process over the substrate W.

A cooling channel 210 may be provided in the base plate 200, e.g., water may flow in the cooling channel 210 in the plasma process. For example, when the substrate W on the electrostatic chuck assembly 1000 is heated to the process temperature during the plasma process, water may flow in the cooling channel 210 in the base plate 200 and may cool down the substrate W while the plasma process is performed at a sufficiently high temperature in the process chamber.

The cooling channel 210 may be shaped into a, e.g., circular or a helical, pipe of which the central line may coincide with the central line of the disk-shaped base plate 200. An additional temperature controller may be provided with the cooling channel 210, so the mass flow of the water may be controlled in response to the temperature of the substrate W.

An additional flow path for supplying a heat transfer material, e.g., inert gases, and a temperature detector may be further provided in the base plate 200. In addition, a plurality of holes may be provided with the base plate 200 and the power lines for supplying an electric power to the absorption electrode 120, and the heat electrode 130 may penetrate through the holes.

The blocking ring 500 may be arranged on the stepped portion 201 of the base plate 200, and may extend upwards in such a configuration that the base plate 200 and the dielectric plate 100 may be enclosed by the blocking ring 500. For example, as illustrated in FIG. 1, the blocking ring 500 may be on an upper surface of the stepped portion 201 to extend along lateral surfaces of the base plate 200 and the dielectric plate 100 to, e.g., completely, surround a perimeter of the base plate 200 and the dielectric plate 100. The focus ring 600 may be arranged on a top portion of the blocking ring 500 in such a way that the substrate W may be enclosed by the focus ring 600.

The blocking ring 500 may separate the dielectric plate 100 from surroundings, so damage to the dielectric plate 100, e.g., potentially caused by residuals of the plasma and particles, may be sufficiently prevented by the blocking ring 500 during the plasma process. For example, as illustrated in FIG. 1, the blocking ring 500 may completely cover lateral surfaces of the dielectric plate 100.

Plasma may be generated in the inner space over the substrate W during the plasma process and may be focused onto the substrate W, which may be secured to the central portion of the dielectric plate 100, by the focus ring 600. Thus, the density and uniformity of the plasma sheath covering the substrate W may sufficiently increase, thereby improving the process uniformity on the substrate W in the plasma process.

For example, the blocking ring 500 and the focus ring 600 may include an insulation material having a dielectric constant less than or equal to about 5. Examples of the insulation material for the blocking ring 500 and the focus ring 600 may include quartz, silicon carbide (SiC) and silicon oxide ($SiO_2$). Thus, the impedance between the blocking ring 500 and the base plate 200 may increase due to the insulation material of the blocking ring 500, so that the high frequency electric power, which may be applied to the base plate 200, may be prevented from dissipating through the side portion of the electrostatic chuck assembly 1000. That is, a larger portion of the high frequency electric power may be transferred to the substrate W from the base plate 200 with minimal dissipation through the side portion of the dielectric plate 100 and the base plate 200, thereby improving the density of the plasma sheath over the substrate W.

The insulating plate 300 may be arranged under the base plate 200, and may have a surface area corresponding to that of the base plate 200, e.g., a top surface of the insulating plate 300 and a bottom surface of the base plate 200 may completely overlap each other. A top surface of the insulating plate 300 may make contact with a bottom surface of the base plate 200, and a bottom surface of the insulating plate 300 may make contact with the ground plate 400. Thus, the conductive base plate 200 may be insulated from its surroundings by the blocking ring 500, i.e., along lateral surfaces thereof, and by the insulating plate 300, e.g., along the bottom surface thereof.

In detail, the insulating plate 300 may have at least two insulation elements having different dielectric constants, so an overall capacitance of the insulating plate 300 may be sufficiently reduced between the base plate 200 and the ground plate 400. For example, the insulating plate 300 may include an insulation body 310 including a first insulation material, and an insulation sink 320 including a second insulation material having a dielectric constant smaller than that of the first insulation material. For example, as illustrated in FIG. 1, the insulation sink 320 may be on, e.g., directly on, a center of the ground plate 400, and the insulation body 310 may be positioned on, e.g., directly on, the ground plate 400 to surround sides and top of the insulation sink 320. This will be described in more detail below with reference to FIGS. 2A-2B. In the present example embodiment, the insulation sink 320 may include air having a dielectric constant of 1.

Therefore, the overall capacitance of the insulating plate 300 may be much smaller, e.g., than that of an insulting plate including a single material with a single dielectric constant, and the impedance between the base plate 200 and the insulating plate 300 may sufficiently increase. Thus, the dissipation of the high frequency electric power may be minimized due to the increased impedance, and as a result, a larger amount of the high frequency electric power may be applied to the substrate W via the base plate 200. Accordingly, the uniformity and density of the plasma sheath over the substrate W may be sufficiently improved in the plasma process.

Figure 2A:
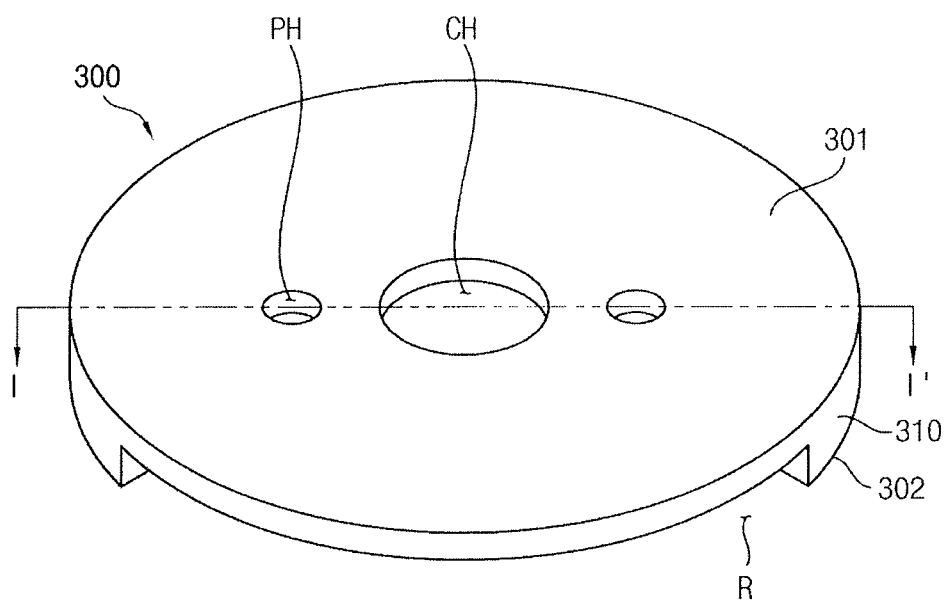
FIG. 2A illustrates a perspective view of the insulating plate of the electrostatic chuck assembly shown in FIG. 1.

In detail, a plurality of holes may be asymmetrically provided in the insulating plate 300, and various wirings may penetrate through the holes of the insulating plate 300 to the inner structures of the base plate 200 and the dielectric plate 100, e.g., to contact the absorption electrode 120 and the heat electrode 130. For example, as illustrated in FIG. 2A, a single central hole may be provided at a central portion of the insulating plate 300, and the power guide structure 700 may be connected to the base plate 200 through the central hole CH. For example, as further illustrated in FIG. 2A, a plurality of peripheral holes PH smaller than the central hole CH may be provided at a peripheral portion of the insulating plate 300, so various power lines may be connected to the absorption electrode 120 and to the heat electrode 130 of the dielectric plate 100 through the peripheral holes PH.

When a sufficient amount of the high frequency electric power dissipates to the surroundings through the insulating plate 300, the asymmetrical configurations of the central hole CH and the peripheral holes PH may be transcribed to the plasma over the substrate W, thereby significantly deteriorating the plasma uniformity in the process chamber. However, as the structure of the insulating plate 300 according to embodiments provides reduced dissipation of high frequency electric power, the transcription of the asymmetrical configuration of the central hole CH and the peripheral holes PH may be prevented or substantially minimized, thereby significantly improving the uniformity and density of the plasma over the substrate W.

High uniformity and density of the plasma across an overall surface of the substrate W may increase the process uniformity of the plasma process to the overall surface of the substrate W. Particularly, when the plasma process is performed on a large-sized wafer, a deposition rate or an etching rate, by using the plasma process, may be substantially uniform at both of the central portion and the peripheral portion of the wafer, which substantially increases the production yield at an edge portion of the large-sized wafer.

Figure 2B:
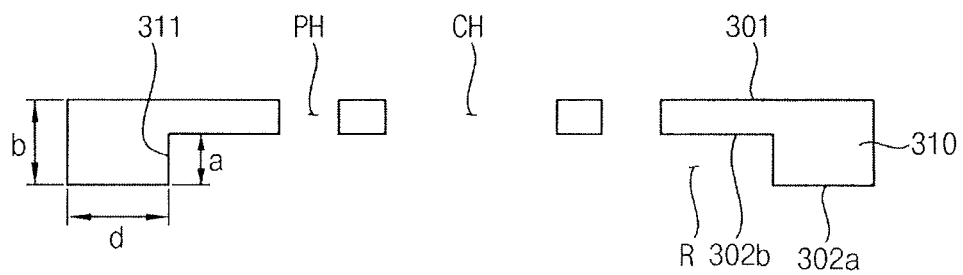
FIG. 2B illustrates a cross sectional view along line I-I' of FIG. 2A.

FIG. 2A is a perspective view illustrating the insulating plate 300, and FIG. 2B is a cross sectional view along line I-I' of FIG. 2A.

Referring to FIGS. 2A and 2B, the insulating plate 300 may have an overall thickness b, as measured between its uppermost and lowermost surfaces, and may have a recess R that recessed from a bottom surface 302 of the insulating plate 300, i.e., a lowermost surface of the insulating plate 300, to a depth smaller than the thickness b. In such a case, the insulation sink 320 may be defined in the recess R and may include an air gap AG (FIG. 1).

The recess R may be shaped into a circular space having a central line coinciding with the central line of the disk-shaped insulating plate 300, such that the recess R may be enclosed by a circular protrusion 311 of the insulating body 310. Thus, the bottom surface 302 of the insulating plate 300 may include a first bottom surface 302a of the protrusion 311 and a second bottom surface 302b corresponding to a bottom of the recess R.

Since the ground plate 400 may be arranged under the insulating plate 300 and the bottom surface 302 of the insulating plate 300 may make contact with the ground plate 400, the circular space of the recess R may be provided as a closed space enclosed by the circular protrusion 311 of the insulating body 310 and the ground plate 400. Thus, the air in the closed space of the recess R may function as the insulation sink 320 having a dielectric constant much smaller than that of the insulation body 310.

The depth a of the recess R may be at least about 0.5 times the thickness b of the insulation body 310, thereby sufficiently reducing the overall capacitance of the insulating plate 300. The plasma uniformity may be much more influenced by the depth a of the recess R rather than a radius of the recess R. For example, the plasma uniformity and density may be significantly improved when the ratio of the recess depth a with respect to the thickness b of the insulation body 310 is about 0.5 or higher, e.g., about 0.5 to about 0.7.

Figure 3A:
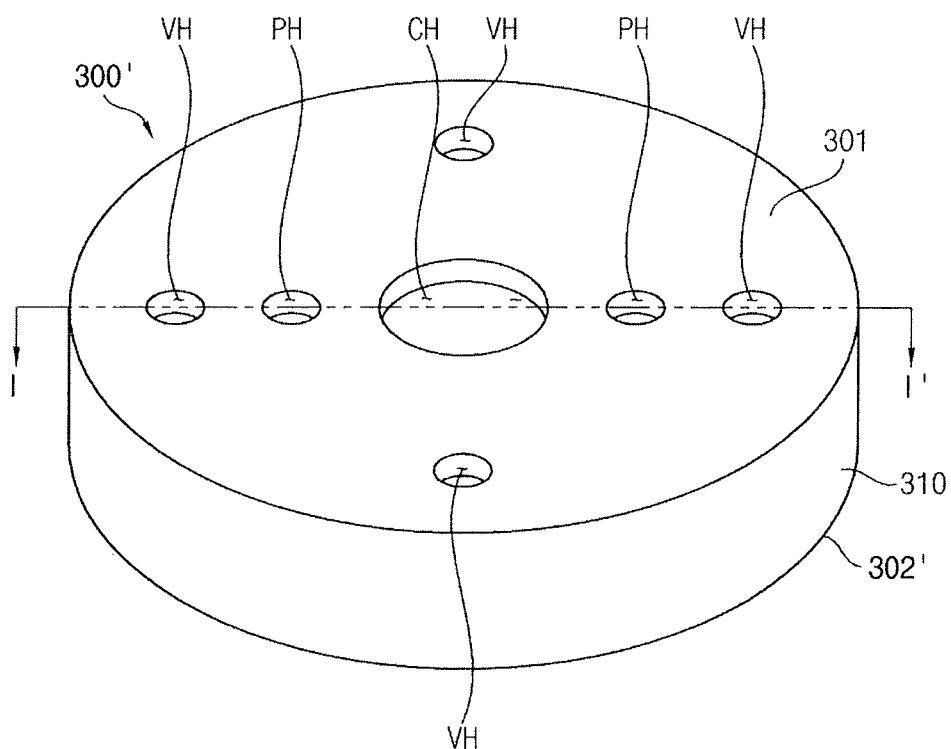
FIG. 3A illustrates a perspective view of a modification of the insulating plate shown in FIG. 2A.
Figure 3B:
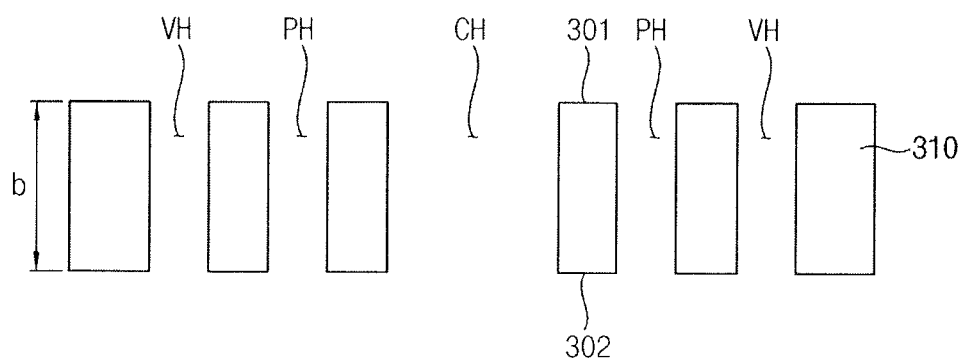
FIG. 3B illustrates a cross sectional view along line I-I' of FIG. 3A.

FIG. 3A is a perspective view illustrating a modification of the insulating plate shown in FIG. 2A, and FIG. 3B is a cross sectional view along line II-II' of FIG. 3A.

Referring to FIGS. 3A and 3B, an insulating plate 300' may include the insulating body 310 on the ground plate 400. The insulating body 310 may include the central hole CH and the peripheral holes PH, as the insulating plate 300 in FIGS. 2A-2B, and further a plurality of void holes VH. Each of the void holes VH may extend through the entire thickness b of the insulating body 310, such that the base plate 200 and the ground plate 400 may be exposed through the void holes VH. An air gap may be filled in each of the void holes VH, such that an insulation sink may be defined in the void holes VH of the insulating plate 300'.

Since the insulation body 310 may be covered by the ground plate 400, the inner space of the void hole VH may be closed by the base plate 200, the insulation body 310, and the ground plate 400. Thus, the insulating plate 300 may include the insulation body 310 and the insulation sink, i.e., defined by the air gaps in the void holes VH that have a smaller dielectric constant than that of the insulation body 310. The number and size of the void holes VH may be varied, e.g., adjusted, according to the overall, e.g., required, capacitance of the insulating plate 300 including the insulation sink.

Referring back to FIG. 1, the ground plate 400 may be arranged under the insulating plate 300, and may have the same bottom shape as the insulating plate 300. For example, the ground plate 400 may be shaped into a disk of which the radius may be the same as that of the disk-shaped insulating body 310. Thus, the ground plate 400 may contact, e.g., completely overlap, with the bottom surface 302 of the insulating plate 300.

A plurality of connection holes may be provided in the ground plate 400 in such a way that the connection holes may communicate with the central hole CH and the peripheral holes PH. Thus, the power guide structure 700 and the power lines may consecutively penetrate the ground plate 400 and the insulating plate 300 to the base plate 200 and the dielectric plate 100, respectively.

As described above, the recess R and the various holes CH, PH, and VH of the insulating plate 300 may be enclosed by the ground plate 400, and the inner space of the recess R and the holes CH, PH and VH may be filled with air. The air in the enclosed spaces may be provided as an insulation sink in the insulating plate 300.

For example, the ground plate 400 may include a conductive metal plate, and may be connected to a housing of the process chamber. Thus, the ground plate 400 may constitute an electrical ground structure of the electrostatic chuck assembly 1000.

The power guide structure 700 may be connected to the base plate 200 from an external high frequency power source, so a high frequency electric power may be applied to the base plate 200 via the power guide structure 700. The power guide structure 700 may include a power guide 710 that may be shaped into a hollow shaft filled with an insulation member 712 and consecutively penetrating the ground plate 400 and the insulating plate 300 to the base plate 200, and a power rod 720 that may penetrate through the insulation plate 300 and may make contact with the base plate 200. For example, as illustrated in FIG. 1, the power rod 720 may be inserted into the hollow shaft, i.e., into a hollow member 711, with the insulation member 712 filling a space between external surfaces of the power rod 720 and internal surfaces of the hollow member 711. The high frequency electric power may be applied to the base plate 200 via the power rod 720, which penetrates through the ground plate 400 and the insulating plate 300 to contact the base plate 200.

In detail, the power guide 710 may be coupled to the connection hole of the ground plate 400 and the central hole CH of the insulating plate 300 by an interference fit. Thus, the power guide 710 may be arranged at a central portion of the recess R of the insulating plate 300.

For example, the power guide 710 may include the hollow member 711, which may include an insulation material (e.g., resin) having a dielectric constant smaller than that of the insulation body 310, and the insulation member 712, which may have a dielectric constant smaller than that of the hollow member 711, and may be filled in the hollow member 711. Thus, the overall capacitance of the insulating plate 300 may be reduced between the base plate 200 and the ground plate 400. Particularly, the power guide 710 may extend to an exterior of the process chamber and may be connected with an external high frequency power source.

The power rod 720 may penetrate through the insulation member 712 in the power guide 710 and may reach the base plate 200. Thus, the power rod 720 may be enclosed by the insulation member 712 in the power guide 710, and a first end portion of the power rod 720 may be in contact with the base plate 200 and a second end portion of the power rod 720 may be connected to the external high frequency power source. For example, the power rod 720 may include a copper coaxial cable.

The high frequency power source may include a radio frequency (RF) power source and a bias power for guiding the plasma in the process chamber to the substrate W on the electrostatic chuck assembly 1000.

In a modified example embodiment, the power guide structure 700 may include only the power rod 720 without the power guide 710. In such a case, the power rod 720 may penetrate through the connection hole and the central hole CH to the base plate 200.

Figure 4:
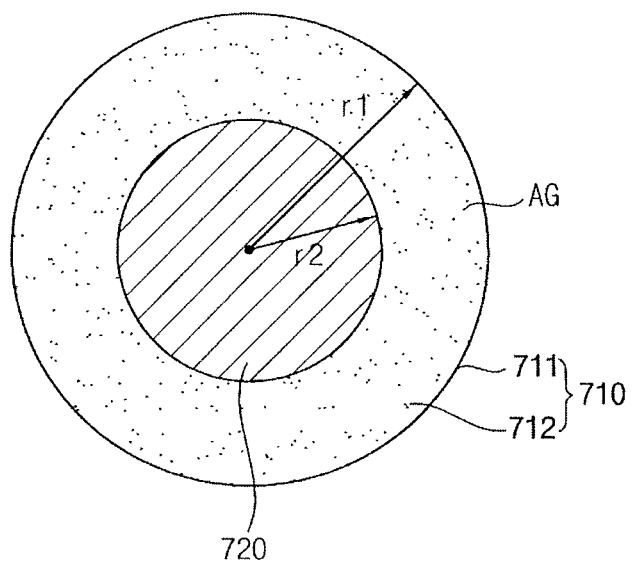
FIG. 4 illustrates a cross sectional view of the power guide structure shown in FIG. 1.

FIG. 4 is a cross sectional view illustrating the power guide structure 700.

Referring to FIG. 4, the power guide 710 and the power rod 720 may be coaxial with each other in the power guide structure 700 in such a way that a second radius r2 of the power rod 720 may be about 0.4 to about 0.6 times a first radius r1 of the power guide 710. As the insulation member 712 is interposed between the power rod 720 and the hollow member 711, a thickness of the insulation member 712 is determined by the ratio between the first and second radii r1 and r2. When the second radius r2 is about 0.4 to about 0.6 times the first radius r1, the power dissipation of the power guide structure 700 may be minimized when the high frequency electric power is applied to the base plate 200 via the power guide structure 700. In the present example embodiment, the insulation member 712 may include an air gap between the power rod 720 and the hollow member 711 of the power guide 700.

When an induction coil is arranged at a top portion of the process chamber having the electrostatic chuck assembly 1000, the impedance between the induction coil and the power rod 720 may be inversely proportional to a rod size r2/r1, i.e., a ratio r2/r1 of the second radius r2 of the power rod 720 with respect to the first radius r1 of the hollow member 711, of the power guide 710. In case that the impedance between the induction coil and the power rod 720 is sufficiently large, a small portion of the high frequency electric power may contribute to the generation of the plasma, and thus, the plasma density may be insufficient for the plasma process on the substrate W. Therefore, the size of the power rod 720 need to be as large as much as possible, so as to decrease the impedance between the induction coil and the power rod 720.

However, a size increase of the power rod 720 may cause reduction of the insulation member 712, and the reduction of the insulation member 712 may increase the overall capacitance between the base plate 200 and the ground plate 400. Particularly, when the insulation member 712 is provided as the air gap AG, the reduction of the gap distance between the hollow member 711 and the power rod 720 may cause an air discharge in the power guide structure 700.

Therefore, according to embodiments, the second radius r2 of the power rod 720 is in a range of about 40% to about 60% of the first radius r1 of the hollow member 711, thereby increasing the plasma uniformity and density, e.g., without air discharge in the power guide structure 700. That is, the rod size r2/r1 of the power guide structure 700 may be in a range of about 0.4 to about 0.6 in case that the insulation member 712 includes the air gap AG.

According to the present example embodiment, the insulating plate 300 under the base plate 200 may include an insulation body 310 and an insulation sink having a dielectric constant smaller than that of the insulation body 310, thereby reducing the overall capacitance of the insulating plate 300 between the base plate 200 and the ground plate 400. Therefore, the plasma density and uniformity may be sufficiently improved in the process chamber having the electrostatic chuck assembly therein.

Further, when an air gap is used as an insulation member between a hollow member and a power rod in a power guide structure, the rod size of the power guide structure may be controlled in a range of about 0.4 to about 0.6, thereby sufficiently reducing the impedance between the induction coil and the power rod of the power guide structure. Thus, a larger amount of the high frequency electric power may be applied to the base plate, to thereby increase the plasma uniformity and density in the process chamber. In addition, the blocking ring enclosing the dielectric plate may include an insulation material having a dielectric constant less than about 5, thereby increasing the impedance of the blocking ring. The high impedance of the blocking ring may reduce the power dissipation form the blocking ring.

Figure 5:
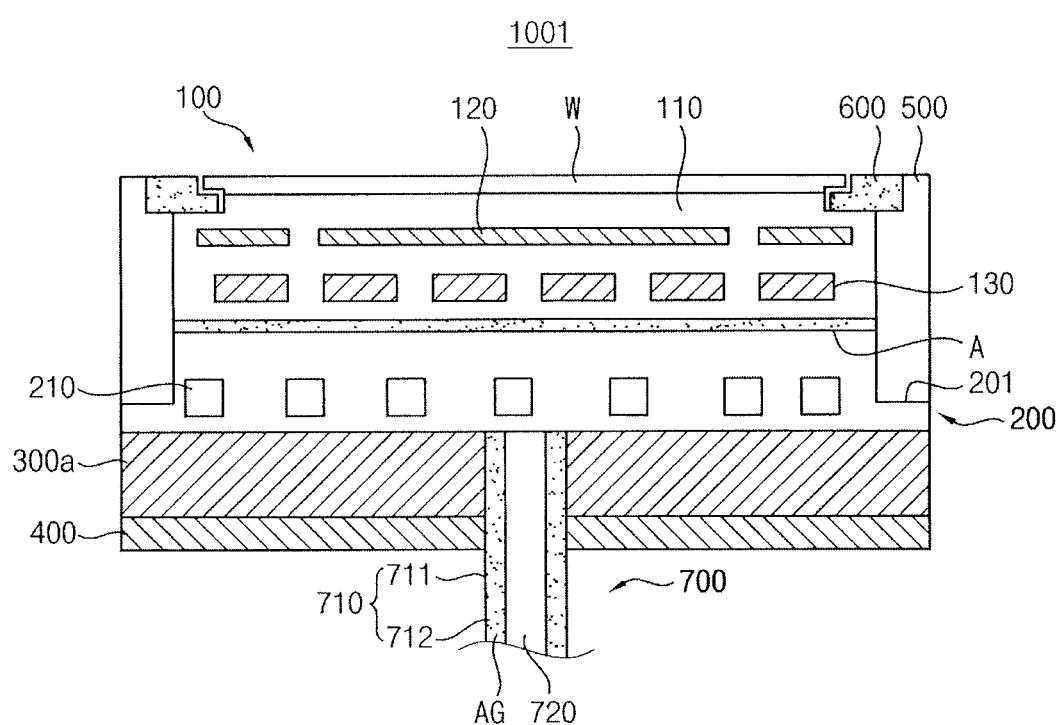
FIG. 5 illustrates a cross-sectional view of an electrostatic chuck assembly in accordance with another example embodiment.

FIG. 5 is a cross-sectional view illustrating an electrostatic chuck assembly in accordance with another example embodiment. In FIG. 5, the electrostatic chuck assembly 1001 may have a substantially same structure as the electrostatic chuck assembly 1000 shown in FIG. 1, except that an insulating plate 300a may include a single insulation material without the insulation sink. Thus, the same reference numbers in FIG. 5 denote the same elements as in FIG. 1.

Referring to FIG. 5, the electrostatic chuck assembly 1001 in accordance with another example embodiment may include the dielectric plate 100 having the absorption electrode 120 therein for generating an electrostatic force and to which the substrate W may be secured by the electrostatic force, the conductive base plate 200 under the dielectric plate 100, the insulating plate 300a under the base plate 200, the ground plate 400 under the insulating plate 300, and the power guide structure 700 penetrating through the ground plate 400 and the insulating plate 300 to reach the base plate 200. The power guide structure 700 may include the power guide 710 having the hollow member 711 and the insulation member 712 filling in the hollow member 711, and the power rod 720 penetrating through the insulation member 712 in the hollow member 711 and making contact with the base plate 200.

The blocking ring 500 may enclose the dielectric plate 100, and thus, the dielectric plate 100 may be isolated from its surroundings by the blocking ring 500. The blocking ring 500 may include an insulation material having a dielectric constant smaller than about 5. The focus ring 600 may be arranged at a top portion of the blocking ring 500 and may enclose the substrate W. The plasma over the substrate W may be focused to the substrate W by the focus ring 600. Particularly, the blocking ring 500 and the focus ring 600 may include any one of, e.g., quartz, silicon carbide (SiC) and silicon oxide ($SiO_2$).

In the present example embodiment, no insulation sink may be provided with the insulating plate 300s, and the insulating plate 300a may include a single insulation material. In such a case, the rod size of the power guide structure 700 and the structures and configurations of the blocking ring 500 may be controlled, e.g., adjusted, for reducing the overall capacitance between the base plate 200 and the ground plate 400. For example, the rod size of the power guide structure 700 may be controlled within a range of about 0.2 to about 0.4, and the blocking ring 500 may include an insulation sink having a dielectric constant smaller than that of the blocking ring 500.

Figure 6:
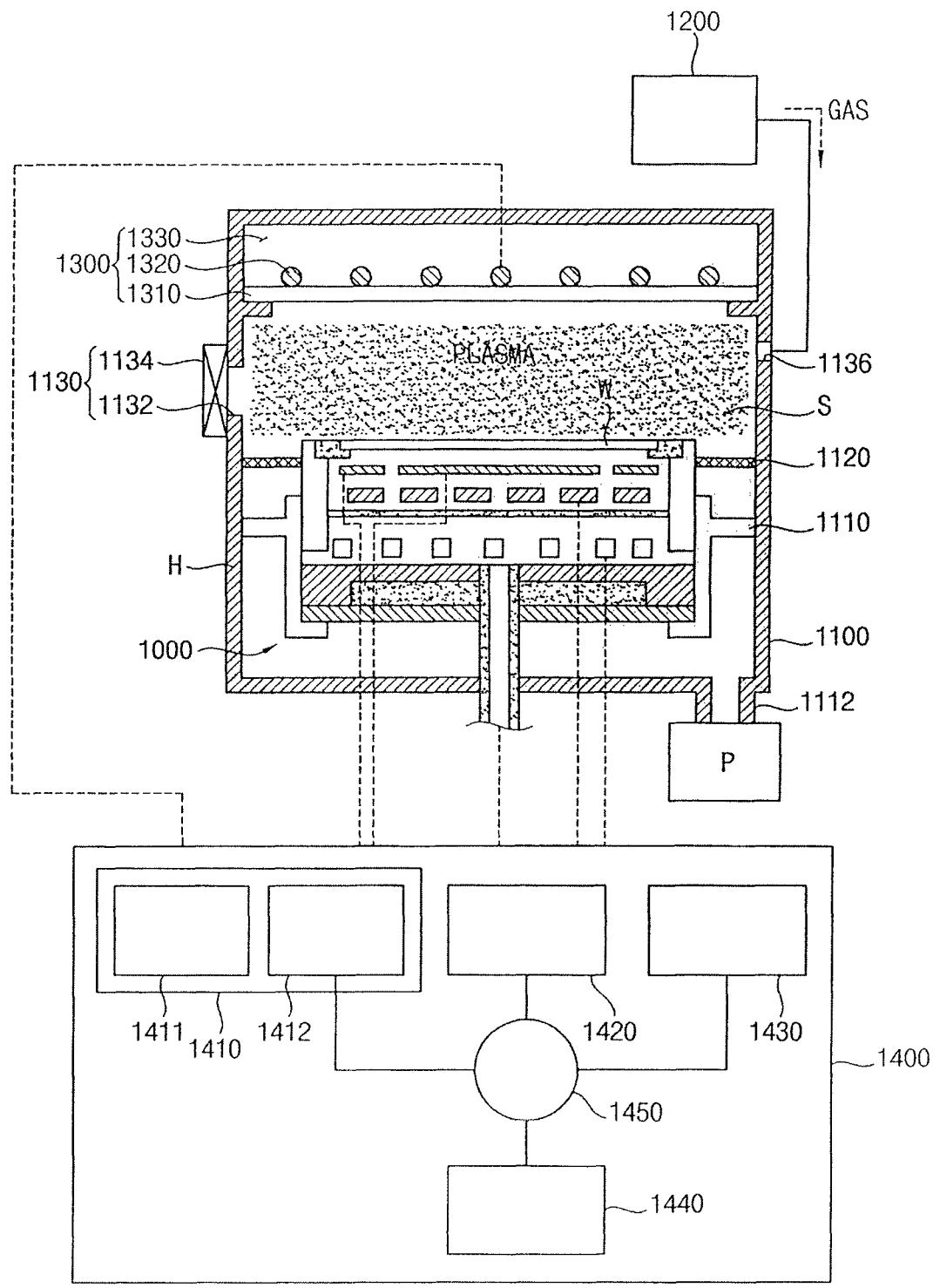
FIG. 6 illustrates a cross sectional view of a plasma apparatus including the electrostatic chuck assembly of FIG. 1 in accordance with an example embodiment.

FIG. 6 is a cross sectional view illustrating a plasma apparatus including the electrostatic chuck assembly 1000 shown in FIG. 1. In the present example embodiment, an inductively coupled plasma (ICP) apparatus is disclosed as the plasma apparatus, in which the plasma is generated by an inductive coupling. However, embodiments may also be applied to a capacitively coupled plasma (CCP) apparatus, in which the plasma is generated by a capacitive coupling.

Referring to FIG. 6, a plasma apparatus 2000 in accordance with an example embodiment may include a process chamber 1100, in which the plasma process is performed, a source supplier 1200 supplying source gases for the plasma process to the process chamber 1100, the electrostatic chuck assembly 1000 arranged at a bottom of the process chamber 1100 and to which the substrate W is secured, a plasma generator 1300 arranged at a top of the process chamber 1100 and generating plasma of the source gases, and a power source 1400 supplying electric power to the electrostatic chuck assembly 1000 and the plasma generator 1300.

The process chamber 1100 may include a cylindrical vacuum chamber that may be defined by a metallic housing H having a sufficient strength and stiffness for the high temperature plasma process. The process chamber 1100 may include a lower chamber in which the electrostatic chuck assembly 1000 may be arranged and an upper chamber in which the plasma generator 1300 may be arranged. The plasma may be generated in a process space S between the plasma generator 1300 and the electrostatic chuck assembly 1000.

The electrostatic chuck assembly 1000 may be arranged at a central portion of the lower chamber and the substrate W may be secured to the electrostatic chuck assembly 1000 in the plasma process. The electrostatic chuck assembly 1000 may have substantially the same structures and configurations as the electrostatic chuck assembly described in detail with reference to FIGS. 1 to 5, thus any further detailed descriptions on the electrostatic chuck assembly 1000 will be omitted.

The electrostatic chuck assembly 1000 may be coupled to the lower chamber by a chuck combiner 1110, and a baffle plate 1120 may be provided at an upper portion of the lower chamber. A plasma space S may be separated from an inner space of the lower chamber by the baffle plate 1120. The baffle plate 1120 may be shaped into a disk plate with which a plurality of penetration holes may be provided. Thus, residuals of the source gases may flow into the lower chamber through the penetration holes of the baffle plate 1120 and may be discharged from the lower chamber through the discharge tube 1112. A vacuum pump P may be installed to the discharge tube 1112. Thus, the flow of the source gases may be controlled by the size of the baffle plate 1120 and the configurations of the penetration holes.

A substrate gate 1130 may be provided at a side of the process chamber 1100. The substrate gate 1130 may include a gate opening 1132 through which the substrate W may be loaded into or unloaded from the process chamber 1100 and a gate valve 1134 for controlling the opening and closing the gate opening 1132. A source inlet 1136 may be provided at other side of the process chamber 1100 opposite to the substrate gate 1130. The source inlet 1136 may be connected to the source supplier 1200.

The source supplier 1200 may be connected to various source reservoirs and may supply the source gases into the process space S of the process chamber 1100 by via a nozzle or a port hole that may be connected to the source inlet 1136.

A coil space may be provided at a top portion of the process chamber 1100 and may be separated from the process space S by a dielectric window 1310. A high frequency antenna 1320 may be arranged on the dielectric window 1310 in a shape of a circular coil or a helical coil. That is, the high frequency antenna 1320 may be arranged in the coil space of the upper chamber and may generate an induced electric filed in the process space S of the process chamber 1100. The source gases that may be supplied into the process space S from the source supplier 1200 may be transformed into plasma of the source gases by the induced electric field.

The power source 1400 may be arranged at an exterior of the process chamber 1100. An electric power may be applied to the electrostatic chuck assembly 1000 and the plasma generator 1300 by the power source 1400. In addition, a process controller 1450 may be arranged in the power source 1400 and the electric power may be controlled in such a way that the plasma process may be performed under optimal conditions.

For example, the power source 1400 may include a high frequency power source 1410 for supplying the high frequency electric power, an absorption power source 1420 for supplying an absorption power to the absorption electrode 120 of the electrostatic chuck assembly 1000, a heat power source 1430 for supplying a heat power to the heat electrode of the electrostatic chuck assembly 1000, a temperature controller 1440 for controlling the water flow through cooling channel 210 in response to the temperature of the dielectric plate 100 and the process controller 1450 for operating the power sources 1410 to 1430 and the temperature controller 1440 and controlling the plasma process under optimal conditions.

The high frequency power source 1410 may include a first source 1411 for supplying a first high frequency electric power to the high frequency antenna 1320 and a second source 1412 for supplying a second high frequency electric power to the base plate 200 of the electrostatic chuck assembly 1000.

For example, the first source 1411 may include a high frequency generator for generating RF power and an impedance matcher for matching the impedance of the high frequency generator with the impedance of the antenna 1320. Thus, the first source 1411 may apply the first high frequency electric power to the antenna 1320. The first high frequency electric power may have a sufficiently high frequency for generating the plasma in the process space S.

The second source 1412 may generate a bias power that may be applied to the base plate 200 of the electrostatic chuck assembly 1000. For example, the second source 412 may generate RF power as the bias power.

The substrate W may be loaded onto the electrostatic chuck assembly 1000 through the substrate gate 1130. Then, the absorption electric power may be applied to the absorption electrode 120 of the electrostatic chuck assembly 1000 by the absorption power source 1420, so that the substrate W may be secured to the electrostatic chuck assembly 1000.

Thereafter, the source gases may be supplied into the process space of the process chamber 1100 from the source supplier 1200, and then the high frequency power may be applied to the antenna 1320 and the base plate 200 of the ESC assembly 1000.

A magnetic field may be generated around the antenna 1320 by the RF power supplied by the first source 1411 and the magnetic force may be applied in the process space S through the dielectric window 1310. An electric field may be induced in the process space S according to the intensity variation of the magnetic field, and the atomic or molecular collisions of the source gases caused by the induced electric field, thereby forming the plasma of the source gases in the process space S. Then, the plasma may be focused onto the substrate W by the bias power that may be applied to the base plate 200 by the second source 1412, thereby performing the plasma process to the substrate W such as a deposition process and an etching process.

Since the insulating plate 300 and the blocking ring 500 may include composite insulation materials, the overall capacitance of the insulating plate 300 and the blocking ring 500 may be sufficiently reduced. In addition, the impedance between the base plate 200 and the power rod 720 may sufficiently increase just by changing the rod size of the power guide structure 700 of the electrostatic chuck assembly 1000. Thus, more high frequency electric power may be applied to the base plate 200, thereby improving the plasma density and uniformity in the process space S in the plasma process.

By way of summation and review, when an electrostatic chuck assembly is used as a stage for securing the substrate in a plasma apparatus, the electrodes in the electrostatic chuck assembly also function as a lower electrode for generating plasma of source gases. Therefore, the plasma uniformity may be a significant factor for the performance of the electrostatic chuck assembly, as well as the electrostatic force. Particularly, plasma uniformity between central and peripheral portions of the substrate may be a significant factor for the performance of an electrostatic chuck assembly when the substrate for the semiconductor devices and the glass for the flat panel devices is increased.

Therefore, example embodiments provide an electrostatic chuck assembly for generating high plasma density and high plasma uniformity, as well as a plasma apparatus having the electrostatic chuck assembly. That is, according to example embodiments, an electrostatic chuck assembly includes an insulating plate, which includes an insulation body and an insulation sink with a smaller dielectric constant than that of the insulation body, thereby reducing an overall capacitance of the insulating plate between a base plate and a ground plate. In addition, a blocking ring, which encloses the dielectric plate, may include an insulation material having a dielectric constant smaller than about 5, thereby sufficiently increasing the impedance among the insulating plate, the blocking ring, and the base plate. Finally, a rod size of a power guide structure may be controlled in a range of about 0.4 to about 0.6, thereby reducing the overall capacitance between the base plate and the power guide structure. Therefore, the power dissipation from the base plate and the blocking ring may be minimized and the power supply to the base plate may be maximized, thereby sufficiently improving the plasma density and uniformity in the process chamber.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An electrostatic chuck assembly, comprising:
a dielectric plate having an absorption electrode to generate an electrostatic force, the dielectric plate securing a substrate by the electrostatic force;

a conductive base plate under the dielectric plate to be applied with a high frequency electric power, the conductive base plate being an electrode to generate plasma; and an insulating plate under the base plate, the insulating plate having:
  an insulation body, the insulation body including a recess from a bottom surface of the insulation body to a depth smaller than a thickness of the insulation body, a portion of the insulation body separating the recess from the conductive base plate and completely covering the recess, and
  an insulation sink filling the recess in the insulation body, the insulation sink having a dielectric constant lower than that of the insulation body.

2. The electrostatic chuck assembly as claimed in claim 1, wherein the insulation sink is an air gap filling the recess.

3. The electrostatic chuck assembly as claimed in claim 2, wherein the insulating plate has a disk shape, and the recess is a circular space having a central line coinciding with a central line of the disk shape of the insulating plate, the recess being defined by a peripheral portion of the insulating plate.

4. The electrostatic chuck assembly as claimed in claim 2, wherein a ratio of the depth of the recess to the thickness of the insulation body is in a range of 0.5 to 0.7.

5. The electrostatic chuck assembly as claimed in claim 2, wherein the insulating plate includes a plurality of void holes through the insulation body, the void holes expose the base plate, and air gaps in the void holes define the insulation sink.

6. The electrostatic chuck assembly as claimed in claim 1, further comprising:
  a ground plate having conductive materials and coupled to the insulating plate under the insulating plate; and
  a power guide structure to apply a high frequency electric power to the base plate.

7. The electrostatic chuck assembly as claimed in claim 6, wherein the power guide structure includes:
  a power guide having a hollow member filled with an insulation member, the power guide penetrating through the ground plate and through the insulating plate to the base plate; and
  a power rod penetrating through the insulation member of the power guide to the base plate and contacting the base plate to apply a high frequency electric power to the base plate.

8. The electrostatic chuck assembly as claimed in claim 7, wherein the insulating plate includes aluminum oxide, the ground plate includes aluminum, and the insulating member of the power guide includes an air gap, the power rod being enclosed by the air gap in the power guide.

9. The electrostatic chuck assembly as claimed in claim 7, further comprising:
  a blocking ring enclosing the dielectric plate such that the dielectric plate is isolated from surroundings; and
  a focus ring on the blocking ring and enclosing the substrate, the focus ring focusing the plasma to the substrate.

10. The electrostatic chuck assembly as claimed in claim 9, wherein the blocking ring includes an insulation material having a dielectric constant less than or equal to 5.

11. The electrostatic chuck assembly as claimed in claim 1, wherein a radius of the recess is equal at least half an outermost radius of the insulation body.

12. A plasma apparatus for performing a plasma process to a substrate, comprising:

a process chamber in which the plasma process is performed;
a source supplier to supply source gases to the process chamber;
an electrostatic chuck assembly at a bottom of the process chamber;
a plasma generator at a top of the process chamber to generate plasma of the source gases; and
a power source to supply high frequency electric power to the electrostatic chuck assembly and to the plasma generator,
wherein the electrostatic chuck assembly includes:
  a dielectric plate having an absorption electrode to generate an electrostatic force, the dielectric plate securing the substrate by the electrostatic force,
  a conductive base plate under the dielectric plate to be applied with the high frequency electric power, the conductive base plate being an electrode to generate the plasma, and
  an insulating plate under the base plate, the insulating plate having:
    an insulation body, the insulation body including a recess from a bottom surface of the insulation body to a depth smaller than a thickness of the insulation body, and a portion of the insulation body separating the recess from the conductive base plate and completely covering the recess, and
    an insulation sink filling the recess in the insulation body, the insulation sink having a dielectric constant lower than that of the insulation body.

13. The plasma apparatus as claimed in claim 12, wherein the insulation sink is an air gap filling the recess.

14. The plasma apparatus as claimed in claim 12, wherein the electrostatic chuck assembly further comprises:
  a ground plate having conductive materials and coupled to the insulating plate under the insulating plate; and
  a power guide structure to apply the high frequency electric power to the base plate, the power guide structure including:
    a power guide having a hollow member filled with an insulation member, the power guide penetrating through the ground plate and through the insulating plate to the base plate, and
    a power rod penetrating through the insulation member of the power guide to the base plate and contacting the base plate to apply a high frequency electric power to the base plate.

15. The plasma apparatus as claimed in claim 14, wherein the insulating plate includes aluminum oxide and the ground plate includes aluminum.

16. The plasma apparatus as claimed in claim 15, wherein the electrostatic chuck assembly further comprises:
  a blocking ring enclosing the dielectric plate such that the dielectric plate is isolated from surroundings, the blocking ring including an insulation material having a dielectric constant less than or equal to 5; and
  a focus ring on the blocking ring and enclosing the substrate, the focus ring focusing the plasma to the substrate.

17. The electrostatic chuck assembly as claimed in claim 12, wherein a radius of the recess is equal at least half an outermost radius of the insulation body.

18. An electrostatic chuck assembly, comprising:
  a dielectric plate having an absorption electrode to generate an electrostatic force, the dielectric plate securing a substrate by the electrostatic force;

a conductive base plate under the dielectric plate to be applied with a high frequency electric power, the conductive base plate being an electrode to generate plasma; and an insulating plate having at least one air gap therein, the conductive base plate being between the dielectric plate and the insulating plate, and a portion of the insulating plate completely covering the at least one air gap.

19. The electrostatic chuck assembly as claimed in claim 18, further comprising a ground plate under the insulating plate, the at least one air gap being enclosed at least between the insulating plate and the ground plate.

20. The electrostatic chuck assembly as claimed in claim 18, further comprising a power guide structure through the insulating plate and contacting the base plate to apply a high frequency electric power to the base plate, the power guide structure including a power rod surrounded by an air gap.

21. The electrostatic chuck assembly as claimed in claim 20, wherein a ratio of a radius of the power rod to a radius of the power rod with the air gap is 0.4 to 0.6.

22. The electrostatic chuck assembly as claimed in claim 18, wherein the at least one air gap extends from a bottom surface of the insulating plate toward a top surface of the insulating plate through at least a portion of the insulating plate.

23. The electrostatic chuck assembly as claimed in claim 18, wherein a radius of the air gap is equal at least half an outermost radius of the insulating plate.

* * * * *